(12) United States Patent
Lin et al.

(10) Patent No.: US 9,348,963 B1
(45) Date of Patent: May 24, 2016

(54) AUTOMATIC ABUTMENT FOR DEVICES WITH HORIZONTAL PINS

(71) Applicant: Cadence Design Systems, Inc., San Jose, CA (US)

(72) Inventors: Min-Ching Lin, Zhubei (TW); Kenny Ferguson, Edinburgh (GB); Ming Yi Fang, Hsin-Chu (TW); SSU-Ping Ko, Hsin-Chu (TW)

(73) Assignee: Cadence Design System, Inc., San Jose, CA (US)

( * ) Notice: Subject to any disclaimer, the term of this patent is extended or adjusted under 35 U.S.C. 154(b) by 0 days.

(21) Appl. No.: 14/502,987

(22) Filed: Sep. 30, 2014

(51) Int. Cl.
*G06F 17/50* (2006.01)

(52) U.S. Cl.
CPC .................................. *G06F 17/5077* (2013.01)

(58) Field of Classification Search
CPC ............ G06F 17/5072; G06F 17/5068; G06F 17/5077
USPC .................................. 716/119, 122, 126, 130
See application file for complete search history.

(56) References Cited

U.S. PATENT DOCUMENTS

| | | | | | |
|---|---|---|---|---|---|
| 5,757,685 | A * | 5/1998 | Ohuchi | ................... | G06F 7/575 708/490 |
| 5,984,510 | A * | 11/1999 | Guruswamy | ....... | G06F 17/5068 716/104 |
| 5,987,086 | A * | 11/1999 | Raman | ................ | G06F 17/5077 716/120 |
| 6,006,024 | A * | 12/1999 | Guruswamy | ....... | G06F 17/5068 716/126 |
| 6,209,123 | B1 * | 3/2001 | Maziasz | .............. | G06F 17/5068 716/123 |
| 6,823,500 | B1 * | 11/2004 | Ganesh | ................ | G06F 17/5072 716/115 |
| 7,508,256 | B2 * | 3/2009 | Hillman | ............ | H01L 27/11807 327/565 |
| 8,707,226 | B2 * | 4/2014 | Lu | ........................ | G06F 17/5068 716/104 |
| 8,863,063 | B2 * | 10/2014 | Becker | .................. | H01L 27/092 716/118 |
| 8,910,100 | B1 * | 12/2014 | Wilson | ................ | G06F 17/5081 716/101 |
| 8,959,472 | B1 * | 2/2015 | Frederick, Jr. | ...... | G06F 17/5077 716/119 |
| 2014/0282289 | A1 * | 9/2014 | Hsu | ...................... | G03F 7/70433 716/51 |
| 2015/0143309 | A1 * | 5/2015 | De Dood | ............ | G06F 17/5068 716/107 |

* cited by examiner

*Primary Examiner* — Sun Lin
(74) *Attorney, Agent, or Firm* — Kenyon & Kenyon LLP

(57) ABSTRACT

A system and method for optimizing a design layout by identifying features for abutment where shapes of the features that trigger the abutment are overlapping or within a predefined proximity of each other. The abutment process is implemented for features that have overlapping pins or that will have overlapping pins when abutted. Connectivity of abutted features is analyzed for the overlapped pins; pins of one of the abutted features are swapped so that at least one overlapping set of horizontal pins is connected to a same net; and a pin of the abutted features can be shortened as necessary to prevent short-circuit between pins connected to different nets. The overlapping pins are then merged. Pins can be shortened by cutting the pin or by adjusting pin style or pin size.

20 Claims, 11 Drawing Sheets

100

200

900

1000

1110

AUTOMATIC ABUTMENT FOR DEVICES WITH HORIZONTAL PINS

BACKGROUND

Aspects of the present invention relate generally to the field of integrated circuit design, and more specifically to systems and methods to optimize a design layout.

Integrated circuit (IC) design is increasingly complex, sometimes involving millions of elements, shapes or geometries, and may be facilitated with an electronic design automation (EDA) tool that allows a designer to interactively position ("place") and connect ("route") various shapes on the circuit. The EDA tool then creates a circuit layout containing the physical locations and dimensions of the circuit's components, interconnections, and various layers from the original design that may then be fabricated, creating the IC. The designed IC is eventually fabricated by transferring or printing the circuit layout to a semiconductor substrate in a series of layers that collectively will form the features that constitute the devices that make up the components of the integrated circuit.

As part of the circuit design, collections of shapes forming features or devices are inserted into the circuit design to perform a desired function. The connections between the features or devices on the circuit are defined with a netlist.

After or during the design and creation of an IC layout, validation and/or optimization operations are often performed on the IC layout using a set of testing, analysis and validation tools. These operations are conventionally performed in part to detect variations in the as-designed layout that may occur during printing due to the optical and/or chemical nature of the processing used to manufacture the IC and to otherwise ensure compliance with certain predefined design rule constraints. For example, as part of the optimization process, the proximity of two elements in a design may trigger an abutment process wherein the elements are adjusted, resized, realigned, or merged. During layout optimization, where the connected features exist in the design such that the connection between the features includes shapes that are overlapping, the shapes may be adjusted such that the overlapping shapes share an associated pin.

In advanced node technologies, the transistor size can be very small. As a result, space for external connections to the devices can be limited. In traditional vertical pin connections, the pin of a transistor is constructed parallel to its gate direction. However, with the small transistor size used in current designs, the design rule constraints limiting channel length often require an alternate configuration. In such designs, a horizontal pin connection style that constructs pins perpendicular to a transistor's gate direction is introduced to overcome the layout constraints for devices with small channel length. Traditional abutment rules and processes automatically overlap, align, and connect transistors with horizontal pins. However, such alignments and connections will often result in a connection short.

Accordingly, there is a need in the art for an improved abutment procedure for transistors having horizontal pins.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

Adjacent features (e.g. transistors or resistors) having horizontal style pins are abutted with a process that avoids short circuits created in pins that are overlapped during the abutment. The abutment function evaluates the context of the features in an IC design and automatically determines the best placement for the features. The described abutment process is triggered by an EDA tool when two features are to be abutted and such abutment will create an overlap of net connections. As part of the abutment process, the connectivity of the abutted features is analyzed for the overlapped pins; pins of one of the abutted features are swapped so that at least one overlapping set of horizontal pins is connected to the same net; and a pin of at least one of the abutted features may be shortened to prevent short-circuit between pins connected to different nets. The overlapping pins are then connected (or merged) to each other after abutment. Pins may be shortened to avoid any design rule violations between the pins of different nets by cutting the pin or by adjusting the pin style or the pin size.

Figure 1:
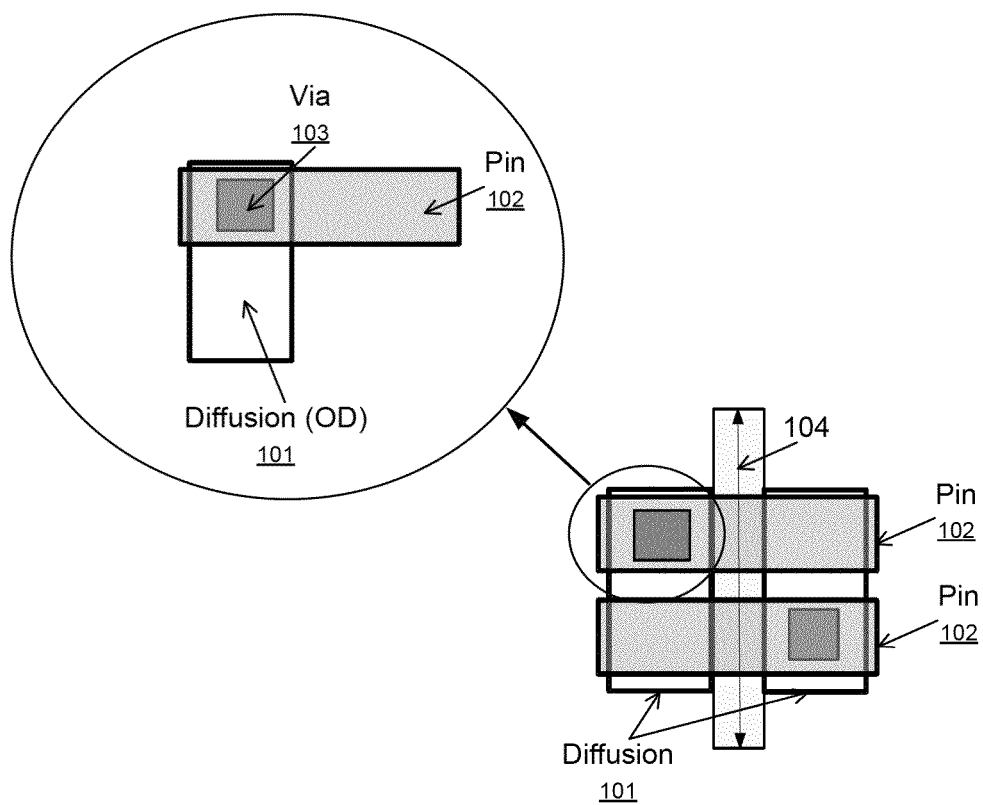
FIG. 1 is a simple block diagram illustrating an exemplary transistor with horizontal pins.

FIG. 1 illustrates an exemplary transistor 100 with horizontal pins. As shown in FIG. 1, a pin 102 of a transistor is connected to the active diffusion (OD) region 101 of the transistor by via 103. Contrary to a conventional vertical pin, the pin 102 in the horizontal configuration is perpendicular to the gate direction 104 for the transistor and crosses the entire width of the active diffusion region 101 of the transistor.

Figure 2:
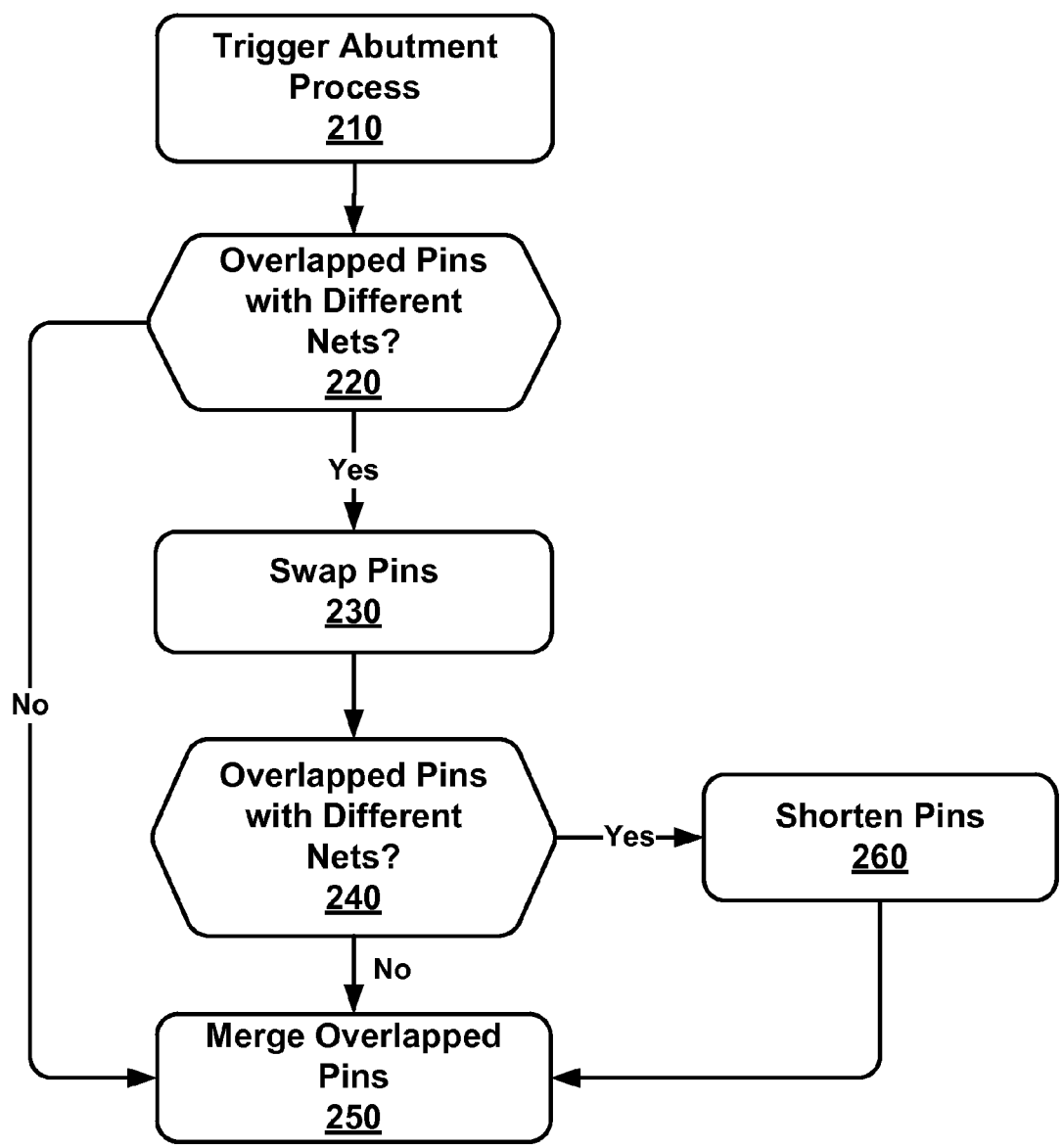
FIG. 2 is a simplified flowchart illustrating an exemplary method for an abutment process according to an embodiment.

FIG. 2 is a simplified flowchart illustrating an exemplary method 200 for an abutment process according to an embodiment. Preliminarily, during layout optimization, an abutment process for two or more adjacent transistors having horizontal pins may be triggered (block 210). According to an embodiment, the described abutment process will be triggered when adjacent transistor devices have overlapping pins. According to an embodiment, the described abutment process will be triggered when two or more transistors are within a predefined proximity of each other.

If the overlapping pins are connected to the same net (block 220), the overlapping pins, along with the associated vias and active diffusion regions, will be merged (block 250). However, if the overlapping pins are not connected to the same net (block 220), additional processing is required before the transistors can be merged.

Figure 3:
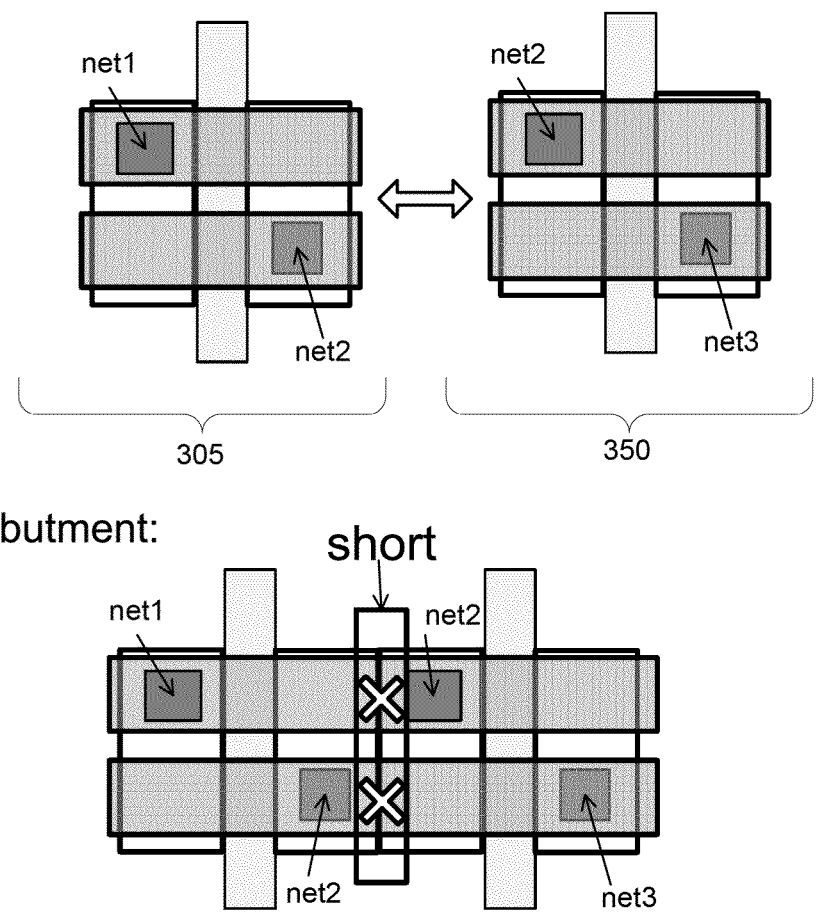
FIG. 3 is a simple block diagram illustrating a pair of adjacent transistors with pins that are not connected to the same net.

FIG. 3 illustrates a pair of adjacent transistors, 305 and 350, with pins that are not connected to the same net. Although the abutment side pins are each connected to net2, the conventional abutment process will merge the two transistors without any additional processing. As shown in FIG. 3, when the two transistors are abutted as-is, short circuits are created at the overlapping pins.

Figure 4:
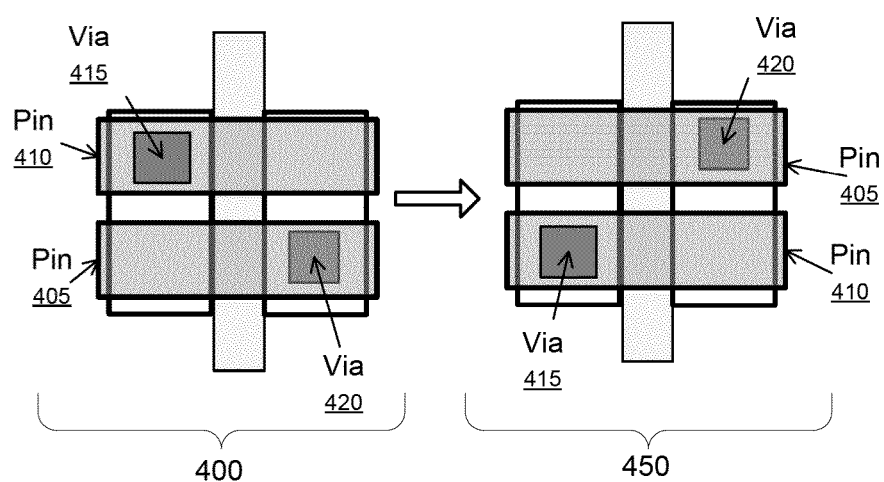
FIG. 4 is a simple block diagram illustrating an exemplary pin swap for a transistor according to an embodiment.

Returning to FIG. 2, to complete the abutment process for adjacent transistors with horizontal pins that overlap but do not share a net, the pins on one of the adjacent transistors may be swapped (block 230). FIG. 4 illustrates an exemplary pin swap for a transistor according to an embodiment. Since the pins are connected to the active diffusion regions by a via, exchanging the locations of the pins and vias connected to the diffusion Source/Drain regions will not affect the operation of the transistor. As shown in FIG. 4, a transistor having pins 405 and 410 with respective vias 415 and 420 in a first configuration 400 can have the pins and related vias switched as shown in alternate configuration 450.

Returning to FIG. 2, once the pins of one of the adjacent transistors have been swapped (block 230), if the overlapping pins are now connected to the same net (block 240), the overlapping pins may be merged into a single pin (block 250). However, if the overlapping pins of the adjacent transistors are not connected to the same net (block 240), the overlapping pin on one transistor may be cut or shortened to remove such overlap (block 260). Then any remaining overlapping pins of the adjacent transistors may be merged (block 250).

Figure 5:
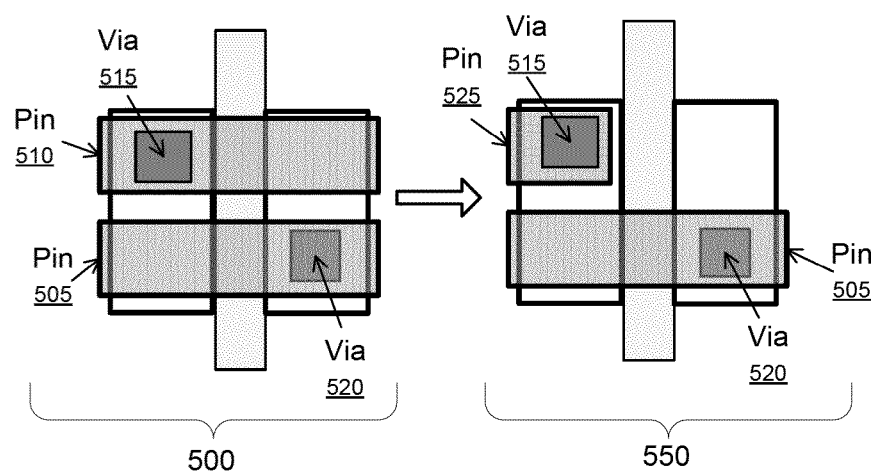
FIG. 5 is a simple block diagram illustrating an exemplary pin cut according to an embodiment.

FIG. 5 illustrates an exemplary pin cut according to an embodiment. As shown in FIG. 5, a transistor having pins 505 and 510 with respective vias 515 and 520 in a first configuration 500 can have a pin cut or shortened. The pin may be cut on the abutted side as shown in configuration 550 of the transistor with shortened pin 525 in place of pin 510.

Figure 6:
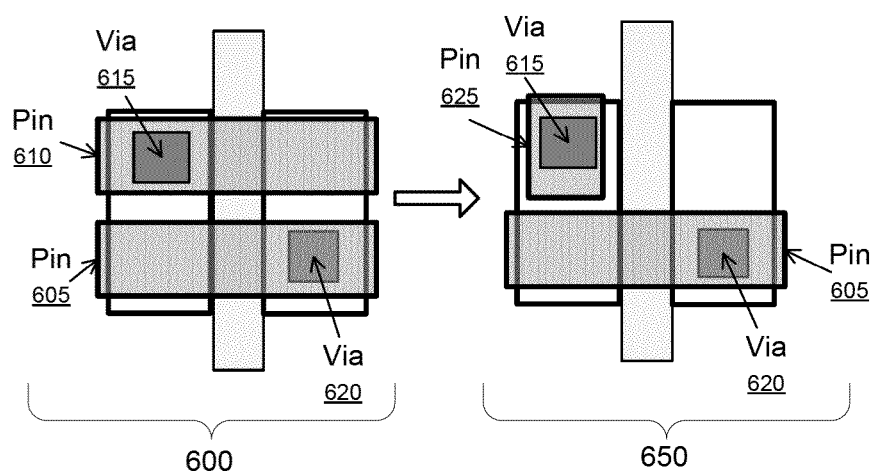
FIG. 6 is a simple block diagram illustrating an exemplary pin switch according to an embodiment.

FIG. 6 illustrates an exemplary pin switch according to an embodiment. As shown in FIG. 6, a transistor having pins 605 and 610 with respective vias 615 and 620 in a first configuration 600 can have the pin 610 shortened by replacing the pin 610 with a pin of a different size or style 625 as shown in configuration 650 of the transistor.

Figure 7:
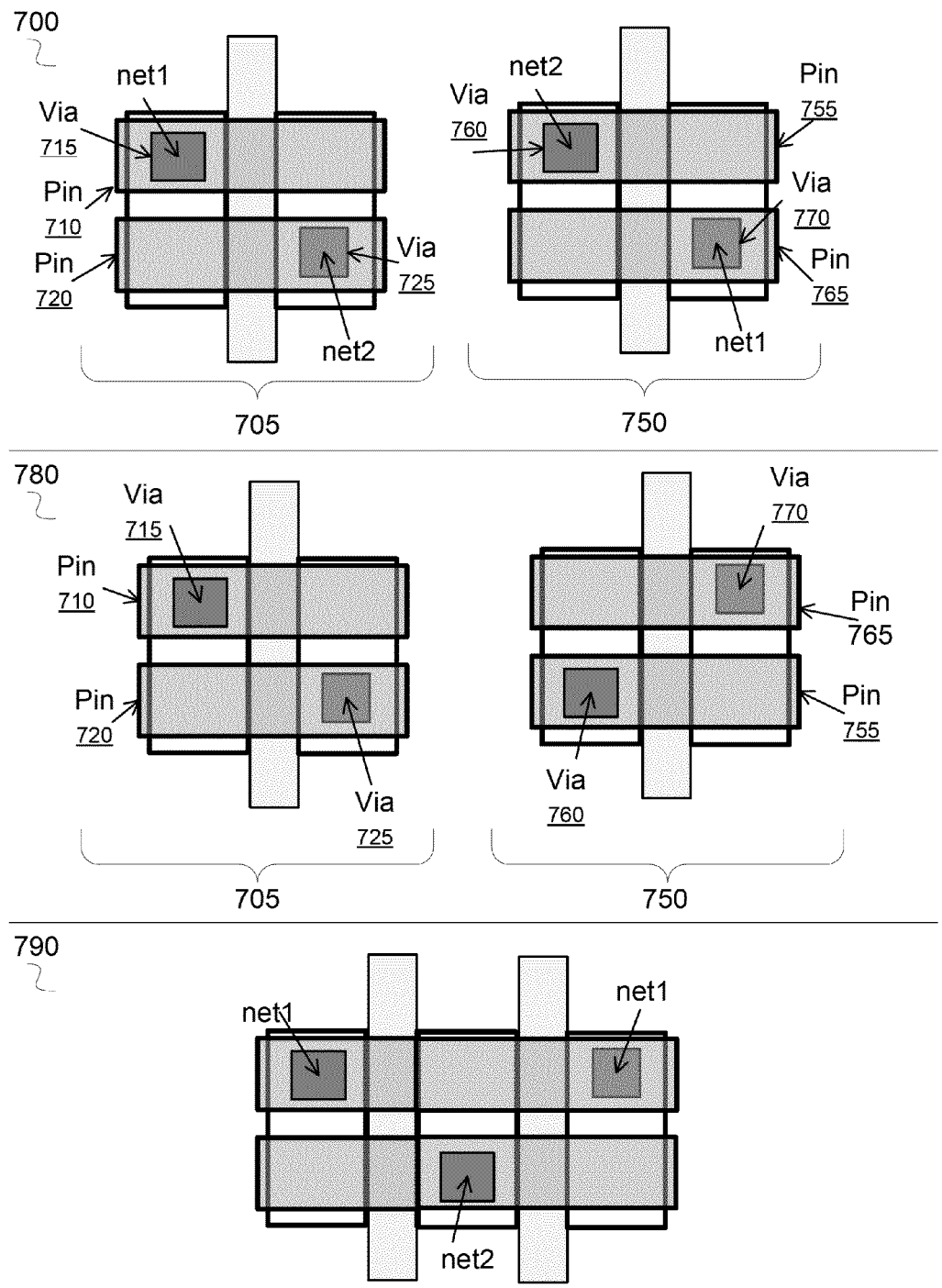
FIG. 7 is a simple block diagram illustrating an exemplary set of adjacent transistors undergoing the abutment process according to an embodiment.

FIG. 7 illustrates an exemplary set of adjacent transistors undergoing the abutment process according to an embodiment. As shown in FIG. 7, the pins of the adjacent transistors 705 and 750 are connected to the same net pair. As shown in part 700 of FIG. 7, transistor 705 is connected to net1 by pin 710 and via 715 and is connected to net2 by pin 720 and via 725. Transistor 750 is connected to net2 by pin 755 and via 760 and is connected to net1 by pin 765 and via 770. The abutment process for the two transistors may begin by swapping the pins of transistor 750 as shown in part 780 of FIG. 7. Then, because each pin that will overlap when the transistors are abutted now share the same net, all potential shorts have been resolved and the two transistors 705 and 750 may be merged as shown in part 790 of FIG. 7. Then, the layout result after abutment contains two pins. Since the pins of non-abutted sides are connected to the same net (net1), these pins can be connected to each other with a layer after abutment.

Figure 8A:
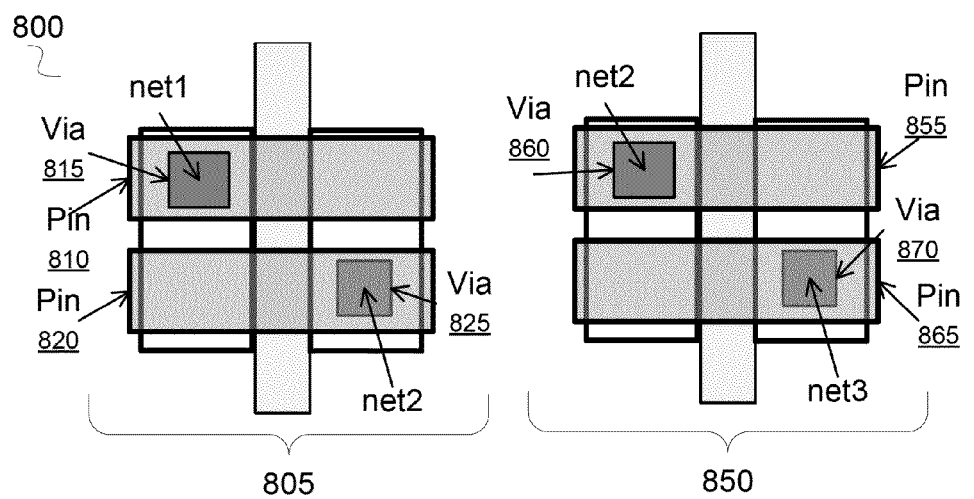
FIGS. 8(A) and 8(B) are simple block diagrams illustrating an exemplary set of adjacent transistors undergoing the abutment process according to an embodiment.
Figure 8A:
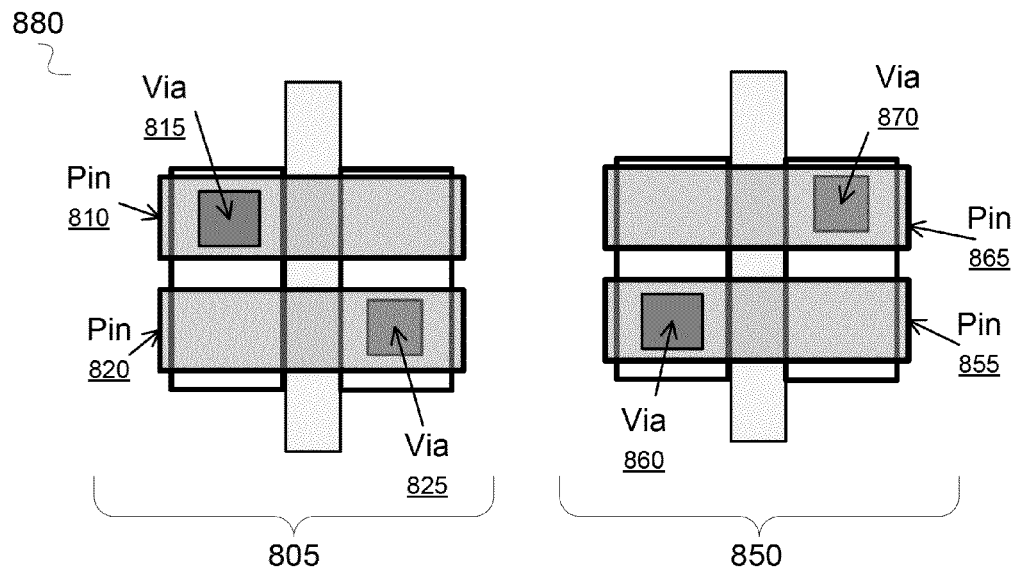
Figure 8B:
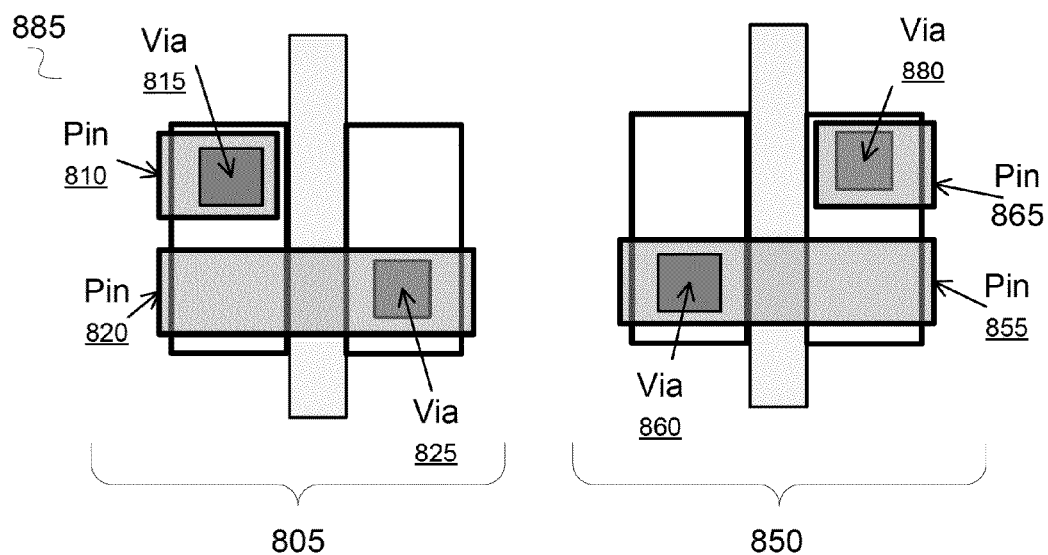
Figure 8B:
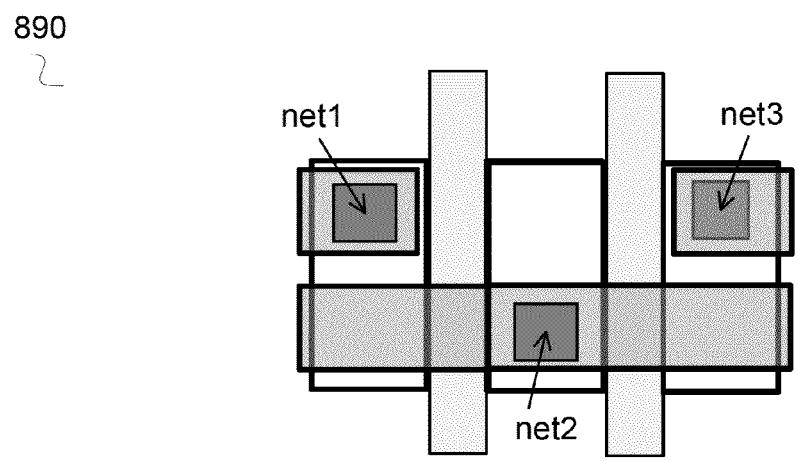

FIGS. 8(A) and 8(B) together illustrate an exemplary set of adjacent transistors undergoing the abutment process according to an embodiment. As shown in in FIG. 8(A), only one set of pins on the adjacent transistors 805 and 850 are connected to the same net. As shown in part 800 of FIG. 8(A), transistor 805 is connected to net1 by pin 810 and via 815 and is connected to net2 by pin 820 and via 825. Transistor 850 is connected to net2 by pin 855 and via 860 and is connected to net3 by pin 865 and pin 870. The abutment process for the two transistors may begin by swapping the pins of transistor 850 as shown in part 880 of FIG. 8(A). Then, the length of the overlapping pins that do not share a net will be shortened as shown in part 885 of FIG. 8(B). As shown, both pin 810 and pin 865 are shortened. According to an embodiment, only one of the overlapping pins need be shortened to eliminate the overlap. Finally, once all potential shorts have been resolved, the two transistors 805 and 865 may be merged as shown in part 890 of FIG. 8(B). Then the layout result will contain three pins with no short circuits.

Although primarily described as a method to ensure compliance with design rules for abutted features having overlapping pins, an embodiment may also be applied to generate optimized layouts for netlists containing multiple transistors. For example, using the systems and methods described herein, multiple transistors connected in series can be optimized by iteratively or automatically triggering the described abutment process for the chain of transistors.

Figure 9:
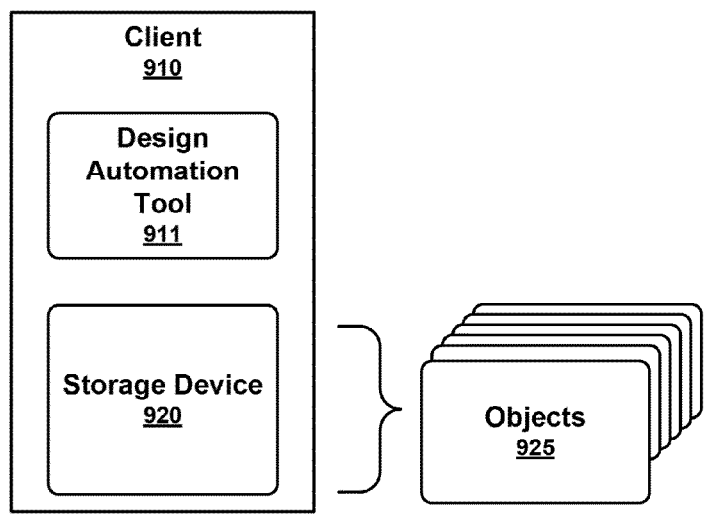
FIG. 9 is a simple block diagram illustrating components of an exemplary system according to an embodiment.

A user may access an integrated circuit design editor or other design layout tool utilizing the described abutment tools in a standalone client system, client-server environment, or a networked environment. FIG. 9 is a simple block diagram illustrating components of an exemplary system 900 according to an embodiment. As shown in FIG. 9, a system 900 may comprise a client 910 executing a design automation tool 911 and having memory storage 920. The client 910 may be any computing system that executes a design automation tool 911 or otherwise facilitates access to memory storage 920 storing layouts and pattern libraries.

Layouts, pattern libraries, and other objects 925 utilized by the design automation tool 911 may be stored in memory storage 920. Layout and design rules may additionally be stored in the memory storage 920. Layout rules may be derived from the design rules of a fabrication process and may include limitations on the design features that may require adjustments to the features and shapes. For example, the layout rules may include rules for the abutment of shapes and features. These layout rules may be encoded as part of an abutment process that may be implemented as part of a design optimization tool.

A user may access the layouts and run the optimization procedures stored in memory storage 920 with the client 910 via a design automation tool 911 capable of accessing memory storage 920 and displaying the layouts and related circuit design data stored therein. The design automation tool 911 may include a user interface, for example a program, application or middleware that acts as a frontend to and facilitates access to objects in memory storage 920, for example, a schematic or circuit design editor or other design editing application. The design automation tool 911 may facilitate an analysis of a design layout to identify features for abutment and perform the abutment procedures described herein. The user may interact with the design automation tool 911 through a number of input devices, such as by inputting a selection as with a mouse or inputting a request as with a keyboard. The user may observe the response to the access request on an output device or display. The design automation tool 911 may run in an application window controlled by the user.

Memory storage may include a file system, hard drive, database, or any other method of storing data. According to an embodiment, multiple memory storage devices may be implemented (not shown). For example, design storage may contain the IC design and related information and a separate storage may contain design rules and instructions for implementing the described abutment processes.

As shown in FIG. 9, a client 910 may be a stand-alone system, as may be of particular interest where the designs being developed are confidential. Additionally, according to an aspect of an embodiment as shown in FIG. 10, a client 1010 may be part of a networked environment.

Figure 10:
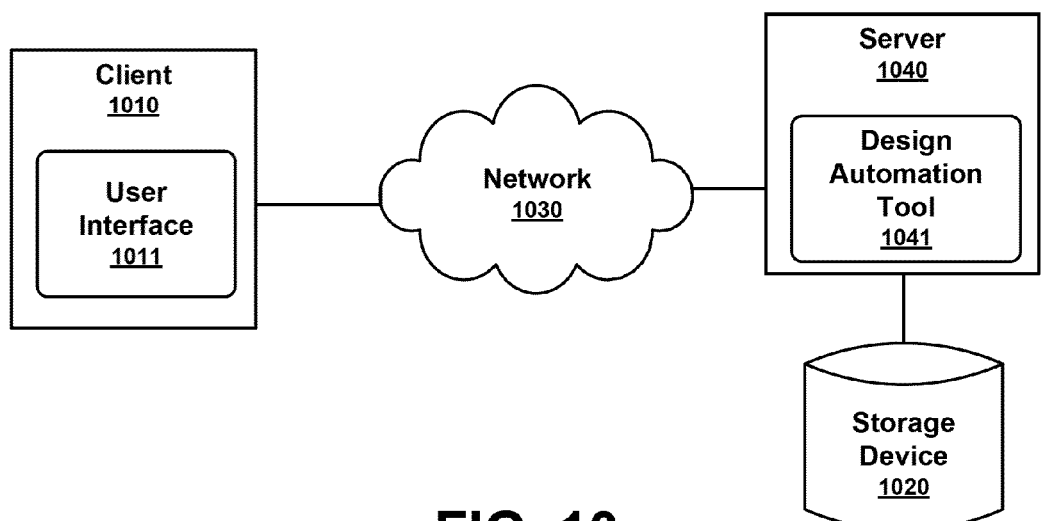
FIG. 10 is a simple block diagram illustrating components of an exemplary system according to an embodiment.

FIG. 10 is a simple block diagram illustrating components of an exemplary system 1000 according to an embodiment. As shown in FIG. 10, system 1000 may include a client 1010 having a user interface 1011. The client 1010 may be connected to a server 1040 via a network 1030. The design automation tool 1041, which in this embodiment is located at server 1040, may have access to storage device 1020 storing layouts, pattern libraries, and other objects utilized by the design automation tool 1041. The server 1040 may include a processor that performs a method in accordance with the disclosed embodiments. Such a server then would be part of an overall design system in accordance with the disclosed embodiments.

A user may access a simulation platform 1041 at the server 1040 via the client 1010 having a user interface 1011 capable of accessing and displaying stored layouts and optimization procedures. The client 1010 may be any computing system that facilitates the user accessing storage device 1020, for example a personal computer. The network 1030 may be a wired or wireless network that may include a local area network (LAN), a wireless network, the Internet, or any other network available for accessing storage device 1020 from the client 1010.

The server 1040 may be a network server accessible to the client 1010 via the network 1030 that may manage access to storage device 1020. The user interface 1011 may receive instructions regarding a layout design from the user and utilizing the optimization procedures stored in memory storage 1020, facilitate optimization of the layout design and the execution of an abutment process. Multiple different clients (not shown) may access storage device 1020 via the network 1030 and request access to the objects stored therein.

In another networked environment, the design automation tool may be executed on a network capable client and access the layout, pattern libraries and other objects stored in memory storage via the server 1040.

Figure 11:
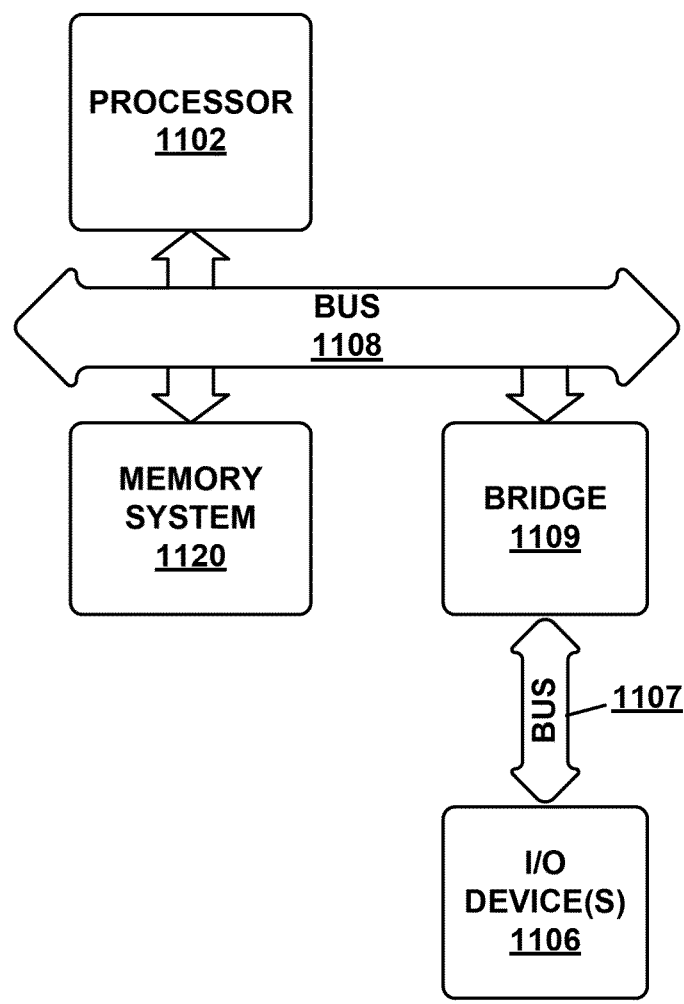
FIG. 11 is a simple block diagram illustrating components of an exemplary client according to an embodiment.

FIG. 11 is a simple block diagram illustrating components of an exemplary client 1110 according to an embodiment. As shown in FIG. 11, the client 1110 configured to execute the design automation tool as described herein may include a processor 1102, a memory system 1120 and one or more input/output (I/O) devices 1106 in communication. The communication can be implemented in a variety of ways and may include one or more computer buses 1107, 1108 and/or bridge devices 1109 as shown in FIG. 11. According to an aspect of an embodiment, the I/O devices 1106 can include network adapters and/or mass storage devices from which the client 1110 can receive commands for optimizing the design.

Although primarily described with reference to abutting adjacent transistors, other circuit features and elements may be abutted according to the embodiments described herein. For example, adjacent resistors having horizontal pins sharing a terminal may be abutted.

In some applications, the modules described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the embodiments. Other applications of the present invention may be embodied as a hybrid system of dedicated hardware and software components. Moreover, not all of the modules described herein need be provided or need be provided as separate units. Additionally, it is noted that the arrangement of the blocks does not necessarily imply a particular order or sequence of events, nor is it intended to exclude other possibilities. Such implementation details are immaterial to the operation of the present invention unless otherwise noted above.

The exemplary methods and computer program instructions may be embodied on a non-transitory computer readable storage medium that may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions. The features of the embodiments of the present invention may be implemented in hardware, software, firmware, or a combination thereof and utilized in systems, subsystems, components or subcomponents thereof.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A method for using a processor to abut a plurality of features in an integrated circuit design layout, the method comprising:
   identifying a set of features in the plurality of features, each feature in the set having pins perpendicular to a gate of said each feature, and adjacent features in the set having overlapped pins connected to different nets in the adjacent features;
   swapping a pair of pins of one of the adjacent features;
   if the adjacent features have overlapped pins connected to different nets after said swapping, shortening length of at least one pin of the overlapped pins; and
   merging overlapped pins that are not connected to different nets after said swapping.

2. The method of claim 1, wherein said shortening includes cutting the at least one pin.

3. The method of claim 1, wherein said shortening includes switching the at least one pin for a pin of a different size.

4. The method of claim 1, wherein said shortening includes switching the at least one pin for a pin of a different style.

5. The method of claim 1, wherein said abutting action is triggered when two adjacent features in the set of features are detected with overlapping pins.

6. The method of claim 1, further comprising: abutting two adjacent features so that at least one set of pins in the two adjacent features are overlapping.

7. The method of claim 6, wherein said abutting action is triggered when two adjacent features in the set of features are detected within a predetermined proximity of each other.

8. The method of claim 6, wherein said method is repeated iteratively to abut a chain of features connected in series.

9. A non-transitory computer readable medium storing instructions that, when executed by a processor, cause the processor to perform a method to abut a plurality of features in an integrated circuit design layout, the method comprising:

identifying a set of features in the plurality of features, each feature in the set having pins perpendicular to a gate of said each feature, and adjacent features in the set having overlapped pins connected to different nets in the adjacent features;

swapping a pair of pins of one of the adjacent features;

if the adjacent features have overlapped pins connected to different nets after said swapping, shortening length of at least one pin of the overlapped pins; and merging overlapped pins that are not connected to different nets after said swapping.

10. The non-transitory computer readable medium of claim 9, wherein said shortening includes cutting the at least one pin.

11. The non-transitory computer readable medium of claim 9, wherein said shortening includes switching the at least one pin for a pin of a different size.

12. The non-transitory computer readable medium of claim 9, wherein said shortening includes switching the at least one pin for a pin of a different style.

13. The non-transitory computer readable medium of claim 9, wherein said abutting action is triggered when two adjacent features in the set of features are detected with overlapping pins.

14. The non-transitory computer readable medium of claim 9, wherein the method further comprises: abutting two adjacent features in the set of features so that at least one set of pins in the adjacent features are overlapping.

15. A system comprising:

a memory to store a layout and a plurality of predefined layout rules;

a processor configured to abut a plurality of features in an integrated circuit design layout by being configured to:

identify a set of features in the plurality of features, each feature in the set having pins perpendicular to a gate of said each feature, and adjacent features in the set having overlapped pins connected to different nets in the adjacent features;

swap a pair of pins of one of the adjacent features;

if the adjacent features have overlapped pins connected to different nets after said swapping, shorten length of at least one pin of the overlapped pins; and merge overlapped pins that are not connected to different nets after said swapping.

16. The system of claim 15, wherein said processor shortens the at least one pin by cutting the at least one pin.

17. The system of claim 15, wherein said processor shortens the at least one pin by switching the at least one pin for a pin of a different size.

18. The system of claim 15, wherein said processor shortens the at least one pin by switching the at least one pin for a pin of a different style.

19. The system of claim 15, wherein said processor is further configured to perform said abutting action when two adjacent features in the set of features are detected with overlapping pins.

20. The system of claim 15, wherein said processor is further configured to abut two adjacent features in the set of features so that at least one set of pins in the adjacent features are overlapping.

* * * * *